United States Patent [19]

Ohfuji

[11] Patent Number: 5,012,185
[45] Date of Patent: Apr. 30, 1991

[54] SEMICONDUCTOR INTEGRATED CIRCUIT HAVING I/O TERMINALS ALLOWING INDEPENDENT CONNECTION TEST

[75] Inventor: Kazuyoshi Ohfuji, Tokyo, Japan
[73] Assignee: NEC Corporation, Tokyo, Japan
[21] Appl. No.: 421,883
[22] Filed: Oct. 16, 1989
[30] Foreign Application Priority Data Oct. 14, 1988 [JP] Japan .................................. 63-258414

[51] Int. Cl.$^5$ ............................................. G01R 31/28
[52] U.S. Cl. ................................. 324/158 R; 371/22.6
[58] Field of Search .............. 324/158 R, 158 T, 73.1; 371/25.1, 22.1, 22.5, 22.6

[56] References Cited

U.S. PATENT DOCUMENTS

4,339,710 7/1982 Hapke ............................ 324/158 T
4,743,841 5/1988 Takeuchi ....................... 324/158 R

*Primary Examiner*—Ernest F. Karlsen
*Attorney, Agent, or Firm*—Sughrue, Mion, Zinn, Macpeak & Seas

[57] ABSTRACT

A semiconductor integrated circuit comprises a plurality of input/output terminals, a test mode input circuit having a mode setting input and for generating a mode control signal, a plurality of test buffer circuits provided for the input/output terminals in one-to-one relation and each having a first terminal connected to a corresponding input/output terminal and a second terminal connected to receive a signal to be supplied to the corresponding input/output terminal or to output a signal inputted through the corresponding input/output terminal. Each test buffer circuit also includes a mode control input connected to receive the mode control signal from the test mode input circuit. When the mode control signal is in a first condition, each test buffer circuit operates to supply a predetermined logical to the corresponding input/output terminal so that the predetermined logical signal is outputted from all the input/output terminals. When the mode control signal is in a second condition different from the first condition, each test buffer circuit operates to output a signal supplied to the first or second terminal to the second or first terminal.

10 Claims, 6 Drawing Sheets

FIGURE 2B    TRUTH TABLE

| A | B | C | D | MODE |
|---|---|---|---|------|
| 0 | 0 | 0 | 0 | NORMAL |
| 0 | 1 | 0 | 1 | OUTPUT"0" |
| 1 | 0 | 1 | 0 | OUTPUT"1" |
| 1 | 1 | 1 | 1 | INHIBIT |

TRUTH TABLE

| INTERNAL SIGNAL I | C | D | OUTPUT OF PREBUFFER | OUTPUT TERMINAL |
|---|---|---|---|---|
| 0 | 0 | 0 | 1 | 0 |
| 1 | 0 | 0 | 0 | 1 |
| X | 0 | 1 | 1 | 0 |
| X | 1 | 0 | 0 | 1 |
| X | 1 | 1 | X | X (INHIBIT) |

TRUTH TABLE

| INTERNAL SIGNAL I | ENABLE SIGNAL E | C | D | OUTPUT TERMINAL |
|---|---|---|---|---|
| 0 | 0 | 0 | 0 | 0 |
| 1 | 0 | 0 | 0 | 1 |
| X | 1 | 0 | 0 | Z |
| X | X | 0 | 1 | 0 |
| X | X | 1 | 0 | 1 |
| X | X | 1 | 1 | X (INHIBIT) |

(X : "1" or "0"
 Z : HIGH IMPEDANCE)

TRUTH TABLE

| A | B | C | D | MODE |
|---|---|---|---|------|
| 0 | 0 | 0 | 0 | NORMAL |
| 0 | 1 | 0 | 1 | OUTPUT"0" |
| 1 | 0 | 1 | 0 | OUTPUT"1" |
| 1 | 1 | 1 | 1 | HIGH IMPEDANCE |

TRUTH TABLE (X: "1" or "0")
(Z: HIGH IMPEDANCE)

| INPUT OF OUTPUT BUFFER I | C | D | OUTPUT TERMINAL |
|---|---|---|---|
| 0 | 0 | 0 | 0 |
| 1 | 0 | 0 | 1 |
| X | 0 | 1 | 0 |
| X | 1 | 0 | 1 |
| X | 1 | 1 | Z |

FIGURE 3D

TRUTH TABLE (X: "1" or "0")
(Z: HIGH IMPEDANCE)

| INTERNAL SIGNAL I | ENABLE SIGNAL E | C | D | OUTPUT TERMINAL |
|---|---|---|---|---|
| 0 | 0 | 0 | 0 | 0 |
| 1 | 0 | 0 | 0 | 1 |
| X | 1 | 0 | 0 | Z |
| X | X | 0 | 1 | 0 |
| X | X | 1 | 0 | 1 |
| X | X | 1 | 1 | Z |

SEMICONDUCTOR INTEGRATED CIRCUIT HAVING I/O TERMINALS ALLOWING INDEPENDENT CONNECTION TEST

BACKGROUND OF THE INVENTION

1. Field of the Invention

The present invention relates to a semiconductor integrated circuit, and more specifically to a semiconductor integrated circuit having a function allowing a test for checking whether or not input/output terminals of the integrated circuit are properly connected to wirings on a after the integrated circuit is assembled on the circuit board. In this specification, the term "input/output terminal" is used to include not only a terminal used for both of an input and an output, but also a terminal used for only an input and a terminal used for only an output.

2. Description of Related Art

Conventionally, semiconductor integrated circuits have not been internally provided with a test circuit for checking a wiring condition after the integrated circuit is assembled on a wiring substrate or printed circuit board. Therefore, a function test for the system realized on the printed circuit board has been performed for each printed circuit board, instead of a connection test between each integrated circuit and the printed circuit board. Alternatively, an assemble testing has been conducted by a function test of the integrated circuit assembled on the printed circuit board by use of an in-circuit tester or likes.

In general, however, the function test for the overall printed circuit board requires a great amount of time and a large number of steps in order to perform all functions of the circuit board, the closer the function of the circuit board becomes to the function of the overall system.

SUMMARY OF THE INVENTION

Accordingly, it is an object of the present invention to provide a semiconductor integrated circuit which is free from the above mentioned inconvenience of the conventional one.

Another object of the present invention is to provide a semiconductor integrated circuit allowing a connection test of input/output terminals of the integrated circuit after it is assembled and wired on a circuit board, and independently of other integrated circuits assembled on the same circuit board.

The above and other objects of the present invention are achieved in accordance with the present invention by a semiconductor integrated circuit comprising a plurality of input/output terminals, a test mode input circuit having a mode setting input to receive a mode setting signal and for generating a mode control signal, a plurality of test buffer circuits provided for the input/output terminals in one-to-one relation and each having a first terminal connected to a corresponding input/output terminal and a second terminal connected to receive a signal to be supplied to the corresponding input/output terminal or to output a signal inputted through the corresponding input/output terminal, each test buffer circuit also including a mode control input connected to receive the mode control signal from the test mode input circuit and operating to supply a predetermined output signal to the corresponding input/output terminal when the mode control signal is in a first condition, so that the predetermined output signal is outputted from all the input/output terminals, each test buffer circuit also operating to output a signal supplied to the first or second terminal to the second or first terminal, when the mode control signal is in a second condition different from the first condition.

The above and other objects, features and advantages of the present invention will be apparent from the following description of preferred embodiments of the invention with reference to the accompanying drawings.

DESCRIPTION OF THE PREFERRED EMBODIMENTS

Figure 1:
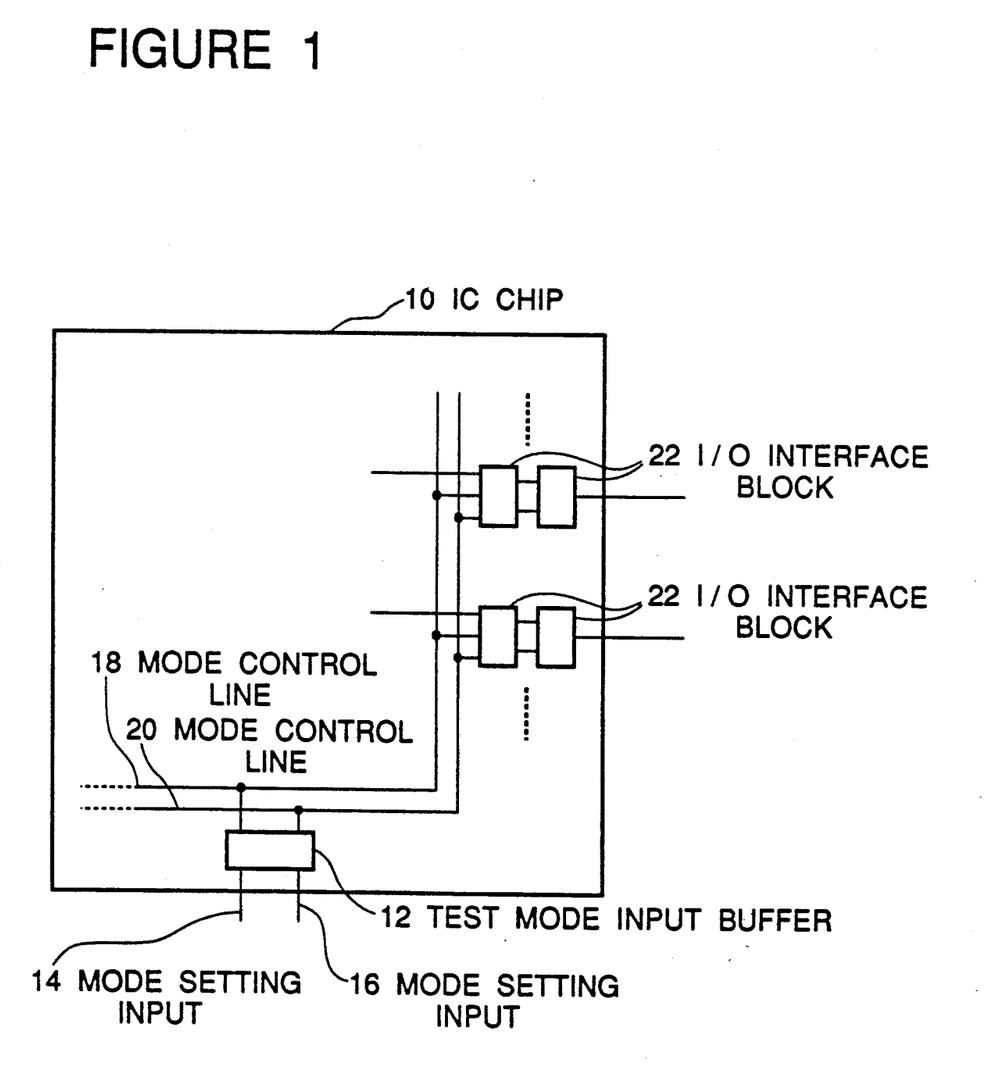
FIG. 1 is an input/output terminal connection layout diagram of an embodiment of the integrated circuit in accordance with the present invention.

Referring to FIG. 1, there is shown an input/output terminal connection layout diagram of an embodiment of the integrated circuit in accordance with the present invention. The shown embodiment includes an integrated circuit chip 10, which comprises a text mode input buffer 12 having two mode setting inputs 14 and 16 for receiving a pair of mode setting signals A and B from an external. The text mode input buffer 12 outputs a pair of mode control signals C and D onto two mode control lines 18 and 20 formed on the integrated circuit chip 10.

The mode control lines 18 and 20 are connected to all input/output buffers 22 which are formed for all input/output terminals in one-to-one relation on the integrated circuit chip 10.

The integrated circuit chip 10 includes various function circuits such as a processing unit, memories, registers, controller, etc, but these function circuits are omitted from FIG. 1 for simplification of drawing, since these function circuits are not important to the spirit of the invention.

Figure 2A:
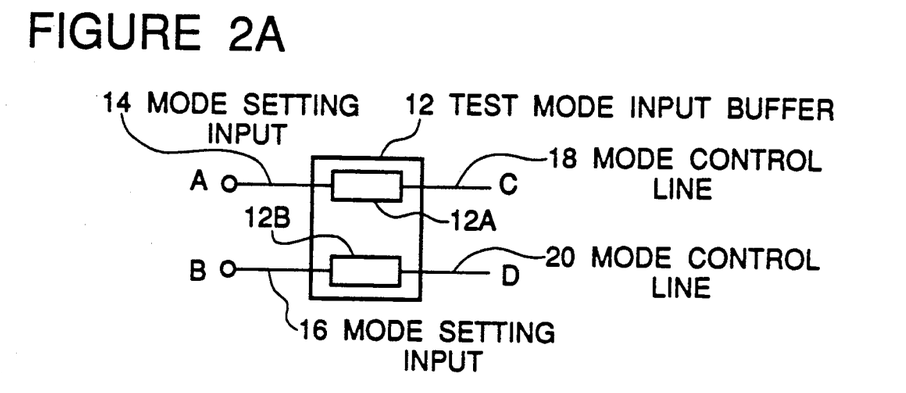
FIG. 2A is a block diagram of an embodiment of the test mode input buffer circuit used in the integrated circuit shown in FIG. 1.
Figure 2B:
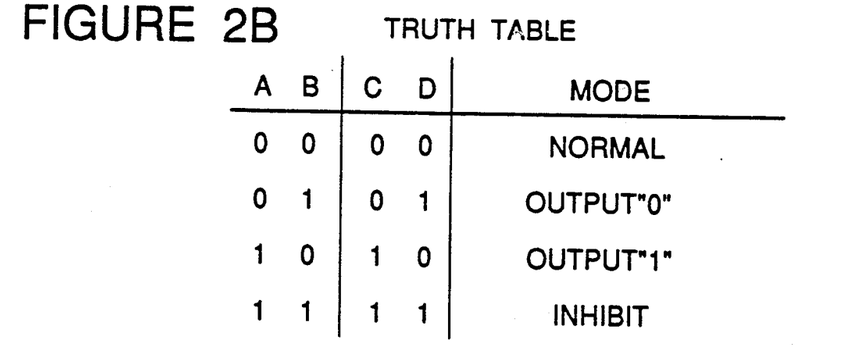
FIG. 2B is a truth table illustrating the relation between an input and an output of the test mode input buffer circuit shown in FIG. 2A.

Turning to FIG. 2A and 2B, there are respectively shown a block of the test mode input buffer 12 and a truth table showing the relation between the input and the output of the test mode input buffer 12. As seen from the truth table shown in FIG. 2B, the mode setting signals A and B are outputted as the mode control signals C and D, respectively, without modification. Therefore, the test mode input buffer 12 can be formed of two non-inverting input buffers 12A and 12B provided for protection from electrostatic breakdown.

In the shown embodiment, a logical combination of the mode control signals C and D means the followings: When both of the mode control signals C and D are at a logical value "0", it means that all the input/output interface blocks perform a function inherent to the respective input/output interface blocks. Namely, an input buffer acts as an input buffer, and an output buffer acts as an output buffer. When the mode control signals C and D are at a logical value "0" and at a logical value "1", respectively, it means that all input/output terminals are forcibly brought to a logical value "0". When the mode control signals C and D are at a logical value "1" and at a logical value "0", respectively, it means that all input/output terminals are forcibly brought to a logical value "1". Therefore, in the latter two cases, an input buffer does not function as an input buffer, and an output buffer does not function as an output buffer. Finally, a combination of the mode control signals C and D both of which are at a logical value "1" is not used.

Figure 2C:
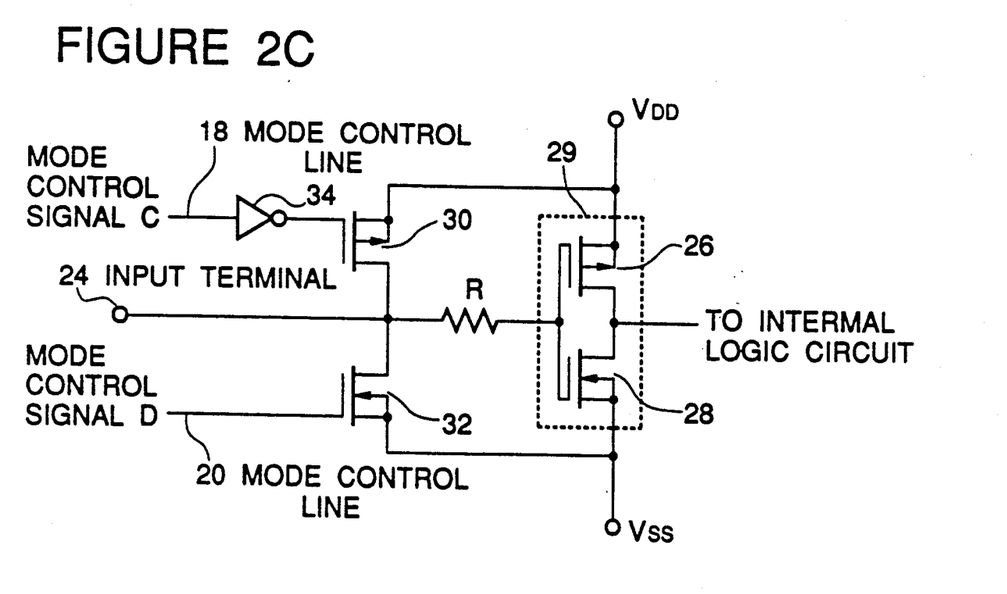
FIG. 2C is a circuit diagram of an input interface block which can be used in the integrated circuit shown in FIG. 1 and can be controlled by the test mode input buffer circuit shown in FIG. 2A.

Referring to FIG. 2C, there is shown a test circuit in accordance with the present invention, combined with an input terminal of the integrated circuit chip. In the shown input buffer, an input terminal 24 is connected through a resistive component R to commonly connected gates of a PMOS transistor 26 and an NMOS transistor 28 of a CMOS circuit 29. A source of the PMOS transistor 26 is connected to a high voltage $V_{DD}$, and a source of the NMOS transistor 28 is connected to a low voltage $V_{SS}$. Commonly connected drains of the PMOS transistor 26 and the NMOS transistor 28 are connected for example to an internal logic circuit (not shown) formed in the integrated circuit chip. Therefore, CMOS circuit 29 forms an inverting input buffer.

The above mentioned structure of the input buffer is well-known to the persons skilled in the art. In accordance with the present invention, a CMOS output circuit is added to the above mentioned structure of the input buffer. The CMOS output circuit includes a PMOS transistor 30 having a source connected to the high voltage $V_{DD}$ and an NMOS transistor 32 having a source connected to the low voltage $V_{SS}$. Drains of the PMOS transistor 30 and the NMOS transistor 32 are commonly connected to the input terminal 24. A gate of the PMOS transistor 30 is connected through an inverter 34 to the mode control line 18 so as to receive an inverted signal of the mode control signal C, and a gate of the NMOS transistor 32 is connected directly to the mode control line 20 to receive the mode control signal D.

In the above mentioned circuit, when both of the mode control signals C and D are "0", both of the PMOS transistor 30 and the NMOS transistor 32 are off, and therefore, a signal applied to the input terminal 24 is supplied through the inverting input buffer (of the PMOS transistor 26 and the NMOS transistor 28) to the internal circuit of the integrated circuit chip. Namely, the input buffer acts as an input buffer. However, when the mode control signals C and D are "0" and "1", respectively, the PMOS transistor 30 is off but the NMOS transistor 32 is turned on. Therefore, the input terminal 24 is forcibly brought to the low voltage $V_{SS}$. Namely the input terminal 24 outputs the logical value "0", and the input buffer no longer acts as an input buffer. In addition, when the mode control signals C and D are "1" and "0", respectively, the PMOS transistor 30 is turned on and the NMOS transistor 32 is off. Therefore, the input terminal 24 is forcibly brought to the high voltage $V_{DD}$, namely to the logical value "1".

Since the inverting input buffer is formed of the CMOS circuit, the input terminal 24 has a high impedance. Therefore, the input terminal can selectively output the logical value "1" or "0" by adding only the CMOS output circuit (composed of the PMOS transistor 30 and the NMOS transistor 32) to the input terminal 24.

Figure 2D:
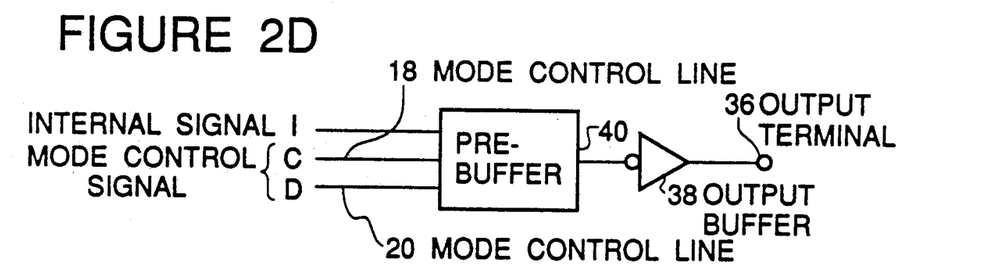
FIG. 2D is a block diagram of an output interface block which can be used in the integrated circuit shown in FIG. 1 and can be controlled by the test mode input buffer circuit shown in FIG. 2A.

Referring to FIG. 2D, there is shown a test circuit in accordance with the present invention, combined with an output terminal of the integrated circuit chip. An output terminal 36 is connected to an output of an inverting output buffer 38, which has been ordinarily used in conventional output buffer circuit. An input of the inverting output buffer 38 is connected to an output of a pre-buffer 40, which has a specific function in accordance with the present invention. Namely, the pre-buffer 40 has a first input connected to receive an internal signal I to be outputted from the integrated circuit through the output terminal 36, and second and third inputs connected to the mode control lines 18 and 20 to receive the mode control signals C and D, respectively. This pre-buffer 40 is formed of a decoder which can realize a logic function shown in the truth table shown in FIG. 2E. A specific construction of the pre-buffer 40 is omitted, but the pre-buffer 40 could be easily assembled by persons skilled in the art since the logical function is given.

Figure 2E:
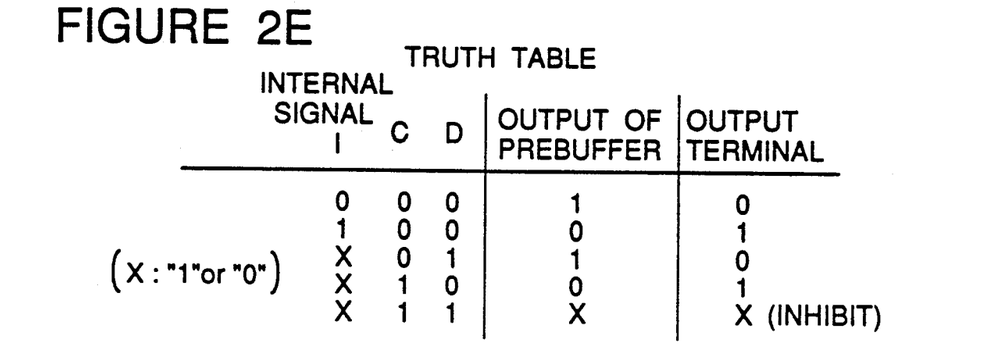
FIG. 2E is a truth table illustrating the relation between an input and an output of the output interface block shown in FIG. 2D when it is controlled by the test mode input buffer circuit shown in FIG. 2A.

As seen from the table shown in FIG. 2E, the circuit shown in FIG. 2D functions as follows: When both of the mode control signals C and D are "0", the internal signal I is outputted as it is through the output terminal 36. Namely, the circuit shown in FIG. 2D acts as an output buffer. However, when the mode control signals C and D are "0" and "1", respectively, the circuit shown in FIG. 2D outputs the logical value "0" to the output terminal 36. In addition, when the mode control signals C and D are "1" and "0", respectively, the circuit shown in FIG. 2D outputs the logical value "1" to the output terminal 36. Namely, in the latter two cases, the circuit shown in FIG. 2D no longer acts as an output buffer.

Figure 2F:
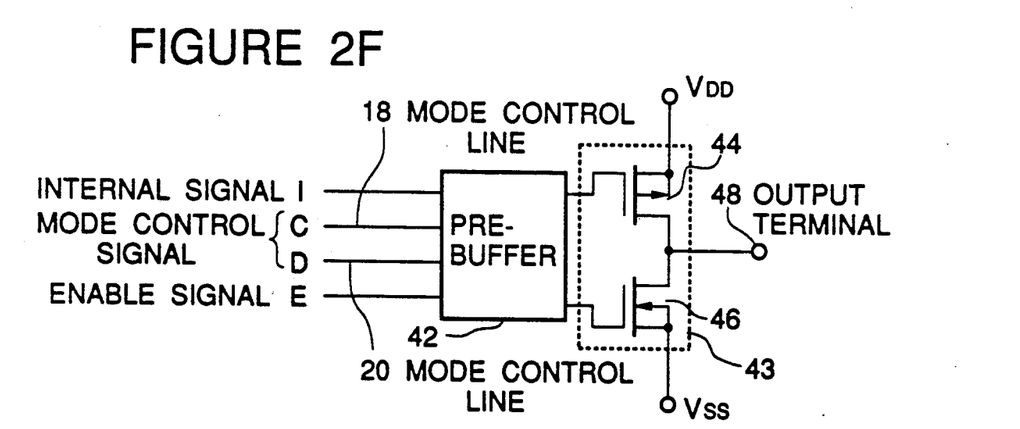
FIG. 2F is a block diagram of a tristate output interface block which can be used in the integrated circuit shown in FIG. 1 and can be controlled by the test mode input buffer circuit shown in FIG. 2A.

Referring to FIG. 2F, there is shown a test circuit in accordance with the present invention, combined with a tristate output buffer terminal of the integrated circuit chip. The shown circuit includes a pre-buffer 42, which has a first input connected to receive an internal signal I to be outputted through an output terminal, second and third inputs connected to the mode control lines 18 and 20 to receive the mode control signals C and D, respectively, and a fourth input connected to receive an enable signal E from an internal circuit (not shown) of the integrated circuit chip.

The pre-buffer 42 also has a first output and a second output connected to a CMOS circuit 43. Specifically, the first output of the pre-buffer 42 is connected to a gate of a PMOS transistor 44 having a source connected to a high voltage $V_{DD}$, and the second output of the pre-buffer 42 is connected to a gate of an NMOS transistor 46 having a source connected to a low voltage $V_{SS}$. Commonly connected drains of the PMOS transistor 44 and the NMOS transistor 46 are connected to an output terminal 48. As seen from FIG. 2F, the PMOS transistor 44 and the NMOS transistor 46 are in a CMOS circuit structure, and therefore, an explanation of an operation of the circuit will be omitted since it is well known to persons skilled in the art or since it can be understand from the description of the circuit shown in FIG. 2C. On the other hand, the pre-buffer 42 is formed to realize a logic function shown in the truth table of FIG. 2G. A specific construction of the pre-buffer 42 is omitted, since the pre-buffer 40 could be easily assembled by persons skilled in the art in accordance with the logical function given.

Figure 2G:
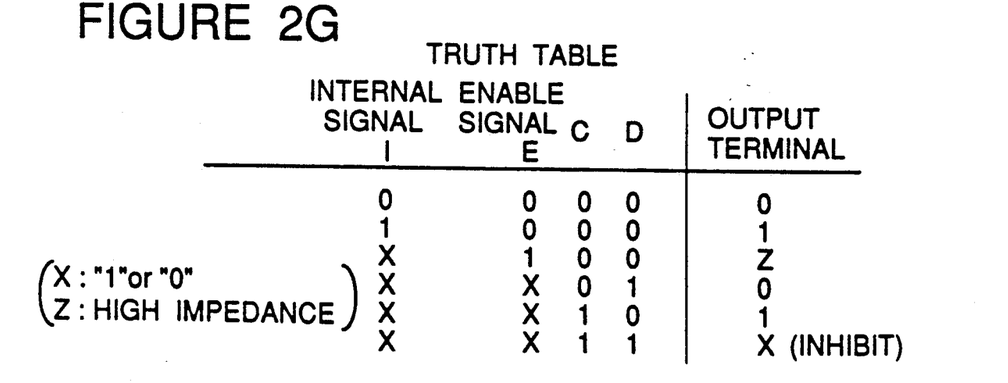
FIG. 2G is a truth table illustrating the relation between an input and an output of the tristate output interface block shown in FIG. 2F when it is controlled by the test mode input buffer circuit shown in FIG. 2A.

As seen from the table shown in FIG. 2G, the circuit shown in FIG. 2F functions as follows: When all of the mode control signals C and D and the enable signal E are "0", the internal signal I is outputted as it is through the output terminal 48. Namely, the circuit shown in FIG. 2F acts as an output buffer. When the enable signal E is "1", both of the two transistors 44 and 46 are rendered off, and therefore, the output terminal 48 is brought into a high impedance condition.

However, when the mode control signals C and D are "0" and "1", respectively, the circuit shown in FIG. 2F outputs the logical value "0" to the output terminal 48, regardless of the logical values of the internal signal I and the enable signal E. In addition, when the mode control signals C and D are "1" and "0", respectively, the circuit shown in FIG. 2F outputs the logical value "1". Namely, in these cases, the circuit shown in FIG. 2F no longer acts as an output buffer.

Figure 2H:
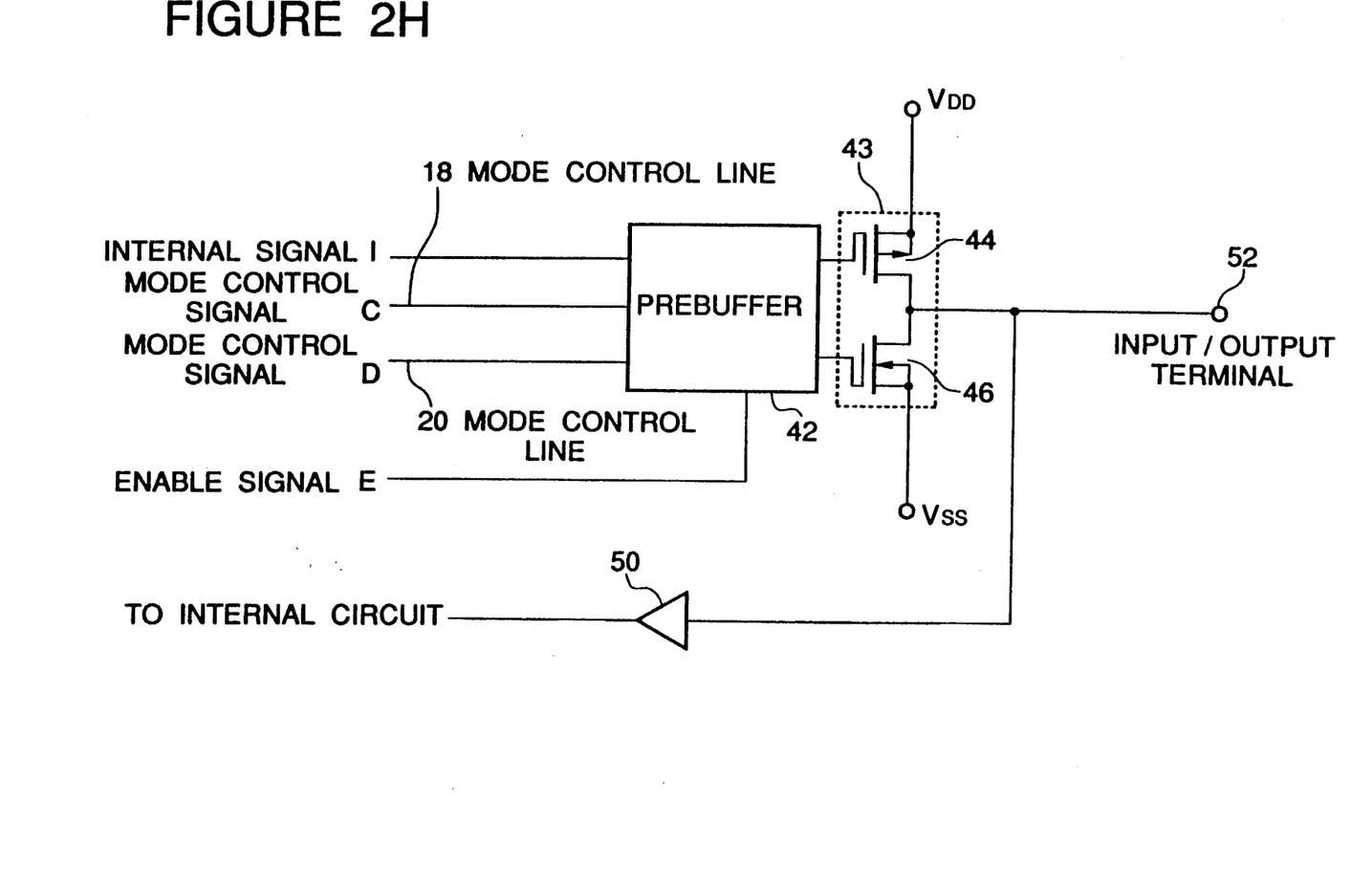
FIG. 2H is a block diagram of a bidirectional interface block which can be used in the integrated circuit shown in FIG. 1 and can be controlled by the test mode input buffer circuit shown in FIG. 2A.

Turning to FIG. 2H, there is shown a test circuit in accordance with the present invention, combined with a bidirectional terminal of the integrated circuit chip. As seen from comparison between FIGS. 2F and 2H, the circuit shown in FIG. 2H is composed of a combination of the tristate output buffer circuit shown in FIG. 2F and an input buffer 50 having an input connected to an input/output terminal 52. Since the input buffer 50 has a high input impedance as seen from FIG. 2C and the description with reference to FIG. 2C, the logical value of the input/output terminal 52 is determined only by the logical value on the connection node between the transistors 44 and 46, and therefore, only by the operation of the pre-buffer 42.

Figure 3A:
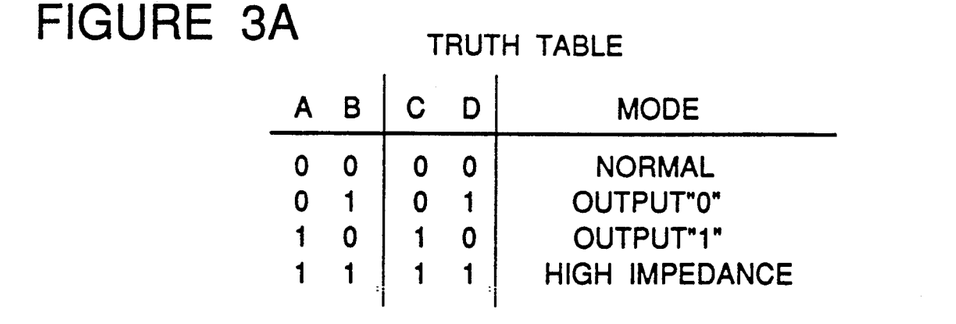
FIG. 3A is a truth table illustrating another example of the relation between an input and an output of the test mode input buffer circuit shown in FIG. 2A.

In an alternative embodiment, the combination of the mode control signal C and D both of which are the logical value "1" can be used as an instruction for a high impedance output. In this case, the truth table becomes as shown in FIG. 3A. This modification will be called a second embodiment hereinafter.

Figure 3B:
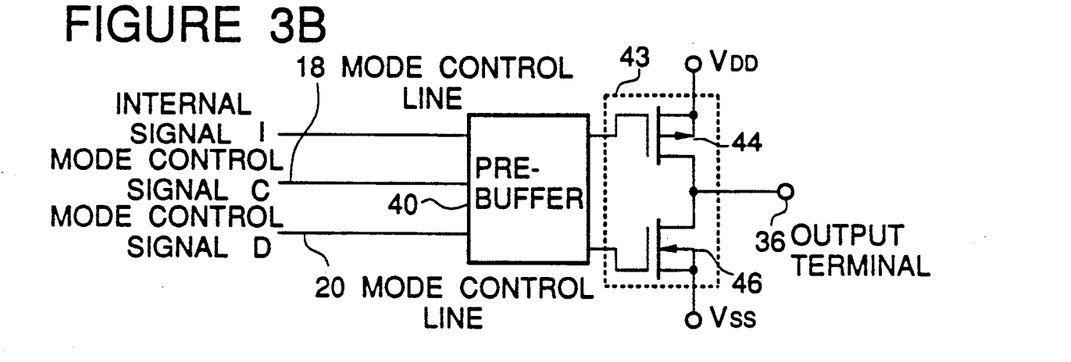
FIG. 3B is a block diagram of an output interface block which can be used in the integrated circuit shown in FIG. 1 and can be controlled by the test mode input buffer circuit operating in accordance with the truth table shown in FIG. 3A.
Figure 3C:
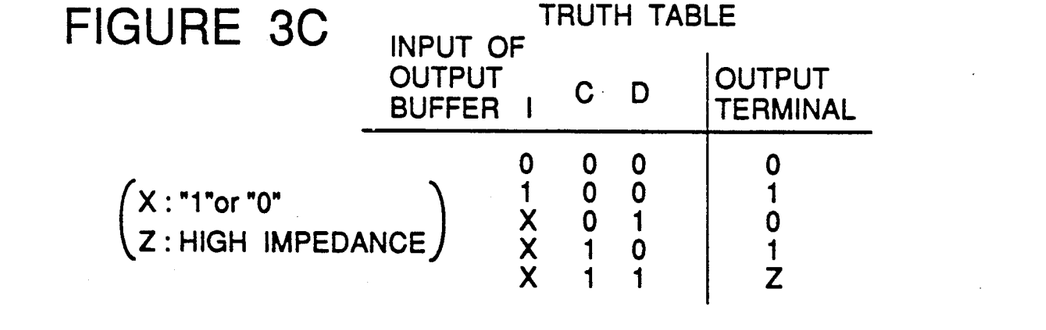
FIG. 3C is a truth table illustrating the relation between an input and an output of the output interface block shown in FIG. 3B when it is controlled by the test mode input buffer circuit operating in accordance with the truth table shown in FIG. 3A.

In the second embodiment, the test circuit connected to the input terminal can be formed similarly to that shown in FIG. 2C. However, the test circuit connected to the output terminal is modified as shown in FIG. 3B. Namely, the test circuit shown in FIG. 3B is composed of a combination of the pre-buffer 40 shown in FIG. 2D and the CMOS circuit 43 shown in FIG. 2F. In this case, the relation between the internal signal I, the mode control signals C and D and the value of the output terminal 36 becomes as shown in the truth table of FIG. 3C.

Figure 3D:
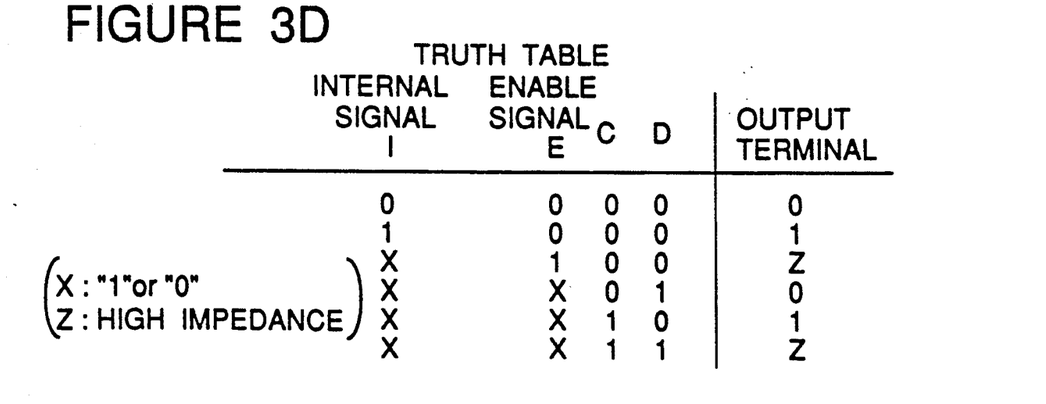
FIG. 3D is a truth table illustrating the relation between an input and an output of the tristate output interface block shown in FIG. 2F when it is controlled by the test mode input buffer circuit operating in accordance with the truth table shown in FIG. 3A.

In the second embodiment, furthermore, the tristate output circuit can be formed similarly to that shown in FIG. 2F, and the relation between the internal signal I, the mode control signals C and D, the enable signal E and the value of the output terminal 48 becomes as shown in the truth table of FIG. 3D. In addition, the test circuit for the bidirectional terminal is the same as that shown in FIG. 2H.

Figure 4:
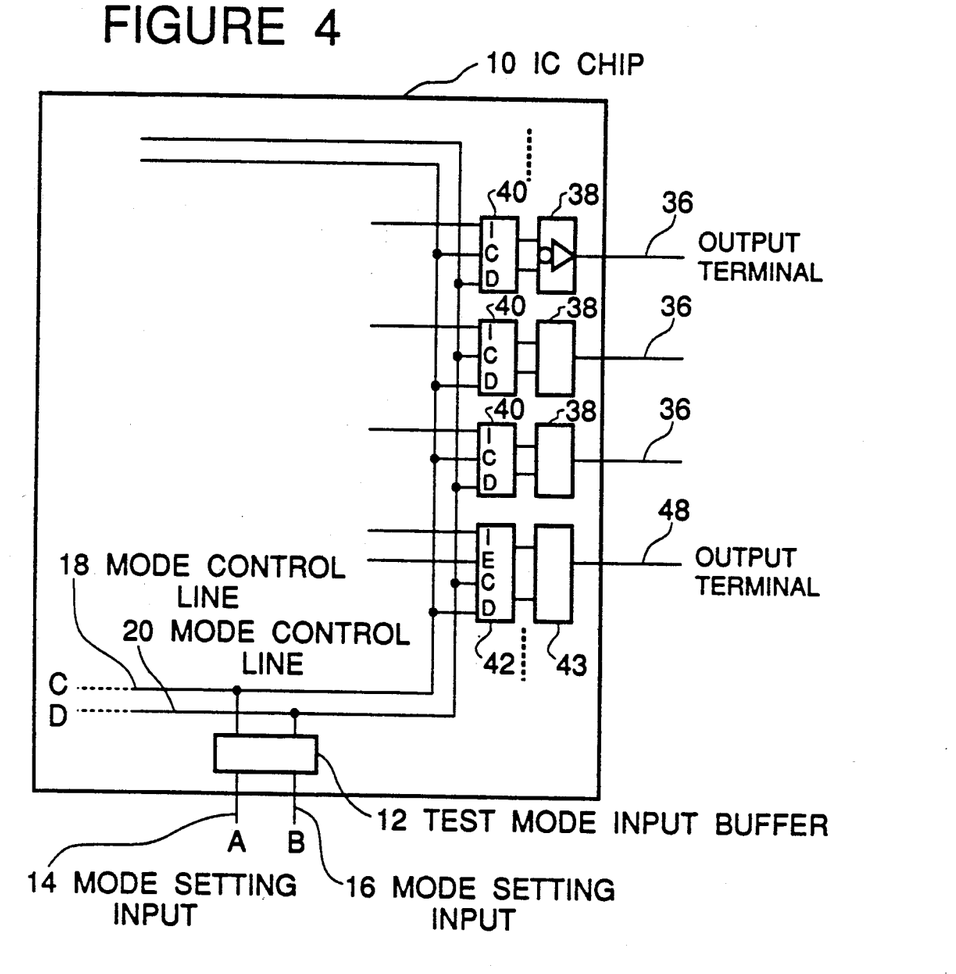
FIG. 4 is an input/output terminal connection layout diagram of another embodiment of the integrated circuit in accordance with the present invention.

Referring to FIG. 4, there is shown a modification of the connection layout pattern shown in FIG. 1. In this modification, the test mode input buffer, the input test circuit and the output test circuits are the same as those which can be used in the embodiment shown in FIG. 1. Only the connection pattern of the mode control lines 18 and 20 is different. Namely, in each pair of adjacent test circuits, if one of the adjacent test circuits has its mode control input C connected to the mode control line 18 and its mode control input D connected to the mode control line 20, the other of the adjacent test circuits has its mode control input C connected to the mode control line 20 and its mode control input D connected to the mode control line 18. With this connection layout pattern, each pair of adjacent input/output terminals of the integrated circuit chip can output different logical value at the testing time.

Figure 5:
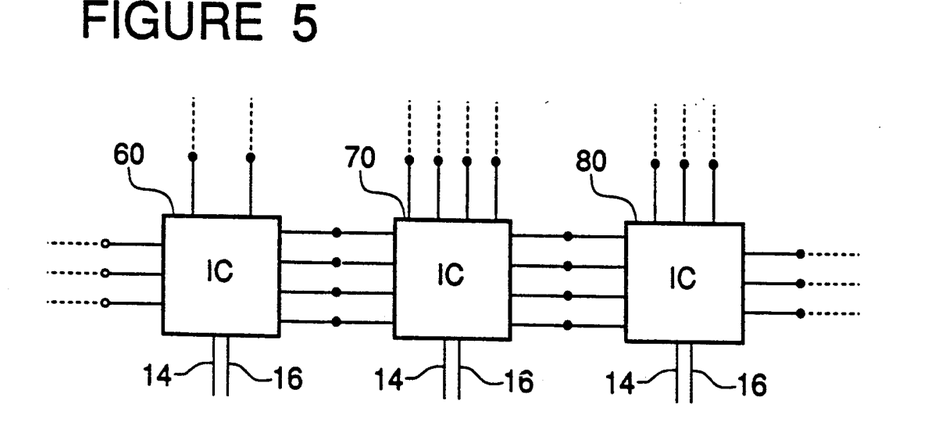
FIG. 5 is a diagrammatic view of integrated circuits in accordance with the present invention assembled on a signal circuit board for illustrating a manner for testing the integrated circuits in accordance with the present invention.

Now, a testing method will be explained with reference to FIG. 5, which illustrates three of some number of integrated circuits assembled on a single circuit board having a plurality of connection terminals. Reference Numerals 60, 70 and 80 designate integrated circuits embodying the present invention. Each of the integrated circuits 60, 70 and 80 has a pair of mode setting inputs 14 and 16. In addition, some input/output terminals of the integrated circuit 70 are connected to some input/output terminals of adjacent integrated circuits 60 and 80, and other input/output terminals of the integrated circuit 70 are connected to other circuits or terminals of the circuit board.

In order to test the assembled condition of the integrated circuit 70, a pair of mode setting signals "1" and "1" are supplied to the mode setting inputs 14 and 16 of all the integrated circuits 60 and 80 connected to the integrated circuit 70, so that all the input/output terminals of the integrated circuits 60 and 80 are brought into a high impedance condition. Namely, all the input/output terminals of the integrated circuits 60 and 80 connected to the integrated circuit 70 will never supply any electric current to the integrated circuit 70. In other words, the integrated circuit 70 is isolated from the integrated circuits 60 and 80. In this condition, the connection condition between the input/output terminals of the integrated circuit 70 and the connection terminals of the circuit board can be examined by supplying the mode setting signals A and B to the mode setting inputs 14 and 16 of the integrated circuit 70 and by measuring a voltage and a current at various measuring points on the circuit board.

As seen from the above description with reference to the accompanying drawings, the integrated circuit in accordance with the present invention is such that the condition of all input/output terminals can be set to a desired logical level by setting the mode setting inputs. Therefore, the connection condition between the input/output terminals of the integrated circuit and the circuit board on which the integrated circuit is assembled, can be examined without a test pattern used in the conventional in-circuit tester, and with a decreased number of testing steps and a reduced amount of time.

Furthermore, in the embodiment which can cause the input/output terminals to selectively assume "0", "1" and "high impedance", it is possible to detect an electrostatic breakdown, a latch-up breakdown, etc., which are principal breakdowns occurring at the time of assembling the integrated circuits to the circuit board.

If each pair of adjacent input/output terminals of an integrated circuit assumes different logic values to each other as in the modification shown in FIG. 4, it is possible to detect a short-circuit between adjacent input/output terminals for example due to soldering.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor integrated circuit comprising a plurality of input/output terminals, at least one mode setting input terminal, a test mode input circuit having at least one mode setting input connected to said at least one mode setting input terminal to receive at least one mode setting signal and for generating at least one mode control signal, a plurality of test buffer circuits provided for said input/output terminals in one-to-one relation and each having a first terminal connected to a corresponding input/output terminal, and a second terminal connected to receive a signal to be supplied from an internal circuit of the integrated circuit to the corresponding input/output terminal or to output to an internal circuit of the integrated circuit a signal inputted through the corresponding input/output terminal from an external circuit of the integrated circuit, each test buffer circuit also including at least one mode control input connected to receive said at least one mode control signal from the test mode input circuit and operating to supply a predetermined output signal to the corresponding input/output terminal when the mode control signal is in a first condition, so that the predetermined output signal is outputted from all the input/output terminals, each test buffer circuit also operating when the mode control signal is in a second condition different from the first condition to output to the second terminal a signal supplied to the first terminal in the case of said second terminal being connected to output to the internal circuit of the integrated circuit the signal inputted through the corresponding input/output terminal from an external circuit of the integrated circuit, or to output to the first terminal a signal supplied to the second terminal in the case of said second terminal being connected to receive the signal to be supplied to the corresponding input/output terminal from an external circuit of the integrated circuit.

2. A semiconductor integrated circuit claimed in claim 1 wherein the test mode input circuit has first and second mode setting inputs for receiving first and second mode setting signals, respectively, and operates to generate first and second mode control signals on first and second mode control lines formed in the integrated circuit, and wherein each test buffer circuit has first and second mode control inputs connected to the first and second mode control lines, so that when both of the first and second mode control signals are at a first logical value, each test buffer circuit operates to output a signal supplied to the first or second terminal to the second or first terminal, and when only one of the first and second mode control signals are at a second logical value different from the first logical value, each test buffer circuit operates to supply the first or second logical value to the corresponding input/output terminal so that the first or second logical value is outputted from all the input/output terminals, regardless of a logical value of a signal supplied or to be supplied through the corresponding input/output terminal.

3. A semiconductor integrated circuit claimed in claim 2 wherein when the first mode control signal is at the second logical value and the second mode control signal is at the first logical value, each test buffer circuit operates to supply the second logical value to the corresponding input/output terminal so that the second logical value is outputted from all the input/output terminals, regardless of a logical value of a signal supplied or to be supplied through corresponding input/output terminal, and when the second mode control signal is at the second logical value and the first mode control signal is at the first logical value, each test buffer circuit operates to supply the first logical value to the corresponding input/output terminals, regardless of a logical value of a signal supplied or to be supplied through corresponding input/output terminal.

4. A semiconductor integrated circuit claimed in claim 2 wherein one of the test buffer circuits includes a CMOS inverting buffer composed of a PMOS transistor and a NMOS transistor having commonly connected gates connected to an input terminal and also having commonly connected drains connected to an internal circuit formed in the integrated circuit, and a CMOS circuit composed of a PMOS transistor and a NMOS transistor having commonly connected drains connected to the input terminal, a gate of the PMOS transistor of the CMOS circuit being connected through an inverter to the first mode control line, and a gate of the NMOS transistor of the CMOS circuit being connected to the second mode control line.

5. A semiconductor integrated circuit claimed in claim 2 wherein one of the test buffer circuits includes a pre-buffer having a first input connected to receive an internal signal from an internal circuit of the integrated circuit, and second and third inputs connected to the first and second control lines, respectively, and an output buffer having an input connected to an output of the pre-buffer and an output connected to an output terminal, the pre-buffer operating in such a manner that when both of the first and second mode control signals are at the first logical value, the output buffer outputs a signal supplied to the first input of the pre-buffer to the output terminal, and when only one of the first and second mode control signals is at the second logical value, the output buffer outputs the first or second logical value to the output terminal, regardless of a logical value of a signal supplied to the first input of the pre-buffer.

6. A semiconductor integrated circuit claimed in claim 2 wherein one of the test buffer circuits includes a pre-buffer having a first input connected to receive an internal signal from an internal circuit of the integrated circuit, second and third inputs connected to the first and second control lines, respectively, and a fourth input connected to receive an enable signal, and an CMOS output buffer having first and second inputs connected to first and second outputs of the pre-buffer, respectively and an output connected to an output terminal, the pre-buffer operating in such a manner that when both of the first and second mode control signals are at the first logical value, the output buffer outputs a signal supplied to the first input of the pre-buffer to the output terminal if the enable signal is active and to bring the output terminal into a high impedance if the enable signal is inactive, and when only one of the first and second mode control signals is at the second logical value, the output buffer outputs the first or second logical value to the output terminal, regardless of a logical value of a signal supplied to the first input of the pre-buffer and regardless of the enable signal.

7. A semiconductor integrated circuit claimed in claim 3 wherein when both of the first and second mode control signals are at the second logical value, each test buffer circuit operates to cause to bring the corresponding input/output terminal into a high impedance condition, regardless of a logical value of a signal supplied or to be supplied through corresponding input/output terminal.

8. A semiconductor integrated circuit claimed in claim 7 wherein one of the test buffer circuits includes a pre-buffer having a first input connected to receive an internal signal from an internal circuit of the integrated circuit, and second and third inputs connected to the first and second control lines, respectively, and an CMOS output buffer having first and second inputs connected to first and second outputs of the pre-buffer, respectively and an output connected to an output terminal, the pre-buffer operating in such a manner that when both of the first and second mode control signals are at the first logical value, the CMOS output buffer outputs a signal supplied to the first input of the pre-buffer to the output terminal, and when only one of the first and second mode control signals is at the second logical value, the CMOS output buffer outputs the first or second logical value to the output terminal, regardless of a logical value of a signal supplied to the first input of the pre-buffer, the pre-buffer also operating in such a manner that when both of the first and second mode control signals are at the second logical value, the CMOS output buffer brings the output terminal into a high impedance.

9. A semiconductor integrated circuit claimed in claim 7 wherein one of the test buffer circuits includes a pre-buffer having a first input connected to receive an internal signal from an internal circuit of the integrated circuit, second and third inputs connected to the first and second control lines, respectively, and a fourth input connected to receive an enable signal, and an CMOS output buffer having first and second inputs connected to first and second outputs of the pre-buffer, respectively and an output connected to an output terminal, the pre-buffer operating in such a manner that when both of the first and second mode control signals are at the first logical value, the output buffer outputs a signal supplied to the first input of the pre-buffer to the output terminal if the enable signal is active, and when only one of the first and second mode control signals is at the second logical value, the output buffer outputs the first or second logical value to the output terminal, regardless of a logical value of a signal supplied to the first input of the pre-buffer and regardless of the enable signal, the pre-buffer also operating in such a manner that the CMOS output buffer brings the output terminal into a high impedance when both of the first and second mode control signals are at the second logical value, or when both of the first and second mode control signals are at the first logical value but if the enable signal is inactive.

10. A semiconductor integrated circuit claimed in claim 2 wherein in each pair of adjacent test buffer circuits, if one of the adjacent test buffer circuits has the first mode control input connected to the first mode control line and the second mode control input connected to the second mode control line, the other of the adjacent test buffer circuits has the first mode control input connected to the second mode control line and the second mode control input connected to the first mode control line.

* * * * *

UNITED STATES PATENT AND TRADEMARK OFFICE
CERTIFICATE OF CORRECTION

PATENT NO.   : 5,012,185

DATED        : April 30, 1991

INVENTOR(S)  : Kazuyoshi OHFUJI

It is certified that error appears in the above-identified patent and that said Letters Patent is hereby corrected as shown below:

Title Page:
Abstract, line 15, after "logical" insert --signal--;

Col. 8, lines 47 and 48, after "corresponding" insert --input/output terminal so that the first logical value is outputted from all the--.

Signed and Sealed this

Eighth Day of December, 1992

Attest:

DOUGLAS B. COMER

*Attesting Officer*     Acting Commissioner of Patents and Trademarks